(12) United States Patent
Kim et al.

(10) Patent No.: US 8,100,511 B2
(45) Date of Patent: Jan. 24, 2012

(54) HEATER OF AN INKJET PRINTHEAD AND METHOD OF MANUFACTURING THE HEATER

(75) Inventors: Kyong-il Kim, Yongin-si (KR);
Sung-joon Park, Suwon-si (KR);
Jun-woo Suh, Seongnam-si (KR);
Hyung Choi, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 539 days.

(21) Appl. No.: 12/250,749

(22) Filed: Oct. 14, 2008

(65) Prior Publication Data
US 2009/0309932 A1    Dec. 17, 2009

(30) Foreign Application Priority Data
Jun. 17, 2008    (KR) .................. 10-2008-0057026

(51) Int. Cl.
*B41J 2/05* (2006.01)
*B41J 2/04* (2006.01)
*H05B 3/00* (2006.01)
*C23C 14/00* (2006.01)

(52) U.S. Cl. .......... 347/62; 347/54; 29/611; 204/192.15

(58) Field of Classification Search .............. 347/62, 347/54; 29/611; 204/192.15
See application file for complete search history.

(56) References Cited

U.S. PATENT DOCUMENTS
6,299,294 B1 * 10/2001 Regan ........................... 347/62
7,080,896 B2 * 7/2006 Bell et al. ..................... 347/62

FOREIGN PATENT DOCUMENTS
JP    62-202753    9/1987

* cited by examiner

*Primary Examiner* — Geoffrey Mruk
(74) *Attorney, Agent, or Firm* — Stanzione & Kim, LLP

(57) ABSTRACT

A heater of a thermal inkjet printhead. The heater is formed of tantalum aluminum oxynitride (Ta—Al—ON), wherein the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

23 Claims, 4 Drawing Sheets

HEATER OF AN INKJET PRINTHEAD AND METHOD OF MANUFACTURING THE HEATER

CROSS-REFERENCE TO RELATED APPLICATIONS

This application claims the benefit of Korean Patent Application No. 10-2008-0057026, filed on Jun. 17, 2008, in the Korean Intellectual Property Office, the disclosure of which is incorporated herein in its entirety by reference.

BACKGROUND OF THE INVENTION

1. Field of the Invention

The present general inventive concept relates to a heater, and more particularly, to a heater for an inkjet printhead, and a method of manufacturing the heater.

2. Description of the Related Art

Inkjet printheads are devices that eject ink droplets onto desired positions of a recording medium to form an image of a predetermined color. Inkjet printheads are categorized into two types of printheads according to the ink ejection mechanism thereof. The first type is a thermal inkjet printhead that ejects ink droplets due to an expansion force of bubbles generated in ink by thermal energy. The other type is a piezoelectric inkjet printhead that ejects ink droplets due to pressure applied to ink due to deformation of a piezoelectric body.

The ink droplet ejection mechanism of a thermal inkjet printhead will now be explained in detail. When a pulse current is supplied to a heater including a heating resistor, the heater generates heat and ink near the heater is rapidly heated up to approximately 300° C., thereby boiling the ink. Accordingly, ink bubbles are generated by ink evaporation, and the generated bubbles expand to exert pressure on the ink filled in an ink chamber. As a result, ink around a corresponding nozzle is ejected from the ink chamber in the form of droplets.

A driving system in an inkjet printer transmits a driving signal to a heater through a flexible printed circuit board (FPCB), a pad, a logic circuit unit, a power transistor, and wires, in order to drive an inkjet printhead. If a resistance of the heater is increased, a ratio of the resistance of the heater to a total resistance is increased, thereby improving energy efficiency. Since the heater can also be driven by a high voltage, a time required to drive the heater is reduced, thereby increasing a number of heaters that can be driven in a given period of time and improving a performance of the inkjet printhead. Accordingly, there are demands for developing a heater material that has a high resistance and a high reliability.

SUMMARY OF THE INVENTION

The present general inventive concept provides a heater for an inkjet printhead which has a high resistance and a high reliability and a method of manufacturing the heater.

Additional aspects and/or utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a heater of an inkjet printhead, the heater being formed of tantalum aluminum oxynitride (Ta—Al—ON), wherein the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

The heater may have a resistivity of about 300 to about 1500 μΩcm The heater may have a nano-crystalline structure or an amorphous structure.

The heater may have a thickness of about 300 to about 3000 Å.

The foregoing and/or other aspects and utilities of the present general inventive concept may also be achieved by providing a method of manufacturing a heater for an inkjet printhead on a substrate, the method includes depositing the heater formed of tantalum aluminum oxynitride on the substrate by reactive sputtering, wherein the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

The temperature of the substrate may range from about 20 to about 350° C., the ratio of the sum of the flow rate of oxygen gas and the flow rate of nitrogen gas to the flow rate of argon gas may range from 0.1:1 to 0.4:1, and the ratio of the flow rate of the oxygen gas to the flow rate of the nitrogen gas may range from 0.1:1 to 10:1.

The foregoing and/or other aspects and utilities of the present general inventive concept may also be achieved by providing an inkjet printhead which includes a substrate having an ink feed hole through which ink is supplied, heaters formed on the substrate and adapted to heat ink and generate bubbles, electrodes formed on the heaters and supplying current to the heaters, a chamber layer stacked on the substrate and allowing a plurality of ink chambers to be formed therein, and a nozzle layer stacked on the chamber layer and allowing a plurality of nozzles to be formed therein, wherein the heaters are formed of tantalum aluminum oxynitride, and the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

The inkjet printhead may further include an insulating layer formed between the substrate and the heaters. The inkjet printhead may further include a passivation layer formed on the substrate to cover the heaters and the electrode. The inkjet printhead may further include anti-cavitation layers formed on the passivation layer to protect the heaters from a cavitation force generated when bubbles burst.

The anti-cavitation layers may include tantalum.

The foregoing and/or other aspects and utilities of the present general inventive concept may also be achieved by providing a method of manufacturing an inkjet printhead, the method includes forming heaters on a substrate, forming electrodes on the heaters, stacking a chamber layer, in which a plurality of ink chambers are formed, on the substrate, and stacking a nozzle layer, in which a plurality of nozzles are formed, on the chamber layer, wherein the heaters are formed of tantalum aluminum oxynitride, and the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen, and the heaters are formed by reactive sputtering.

BRIEF DESCRIPTION OF THE DRAWINGS

The above and/or other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
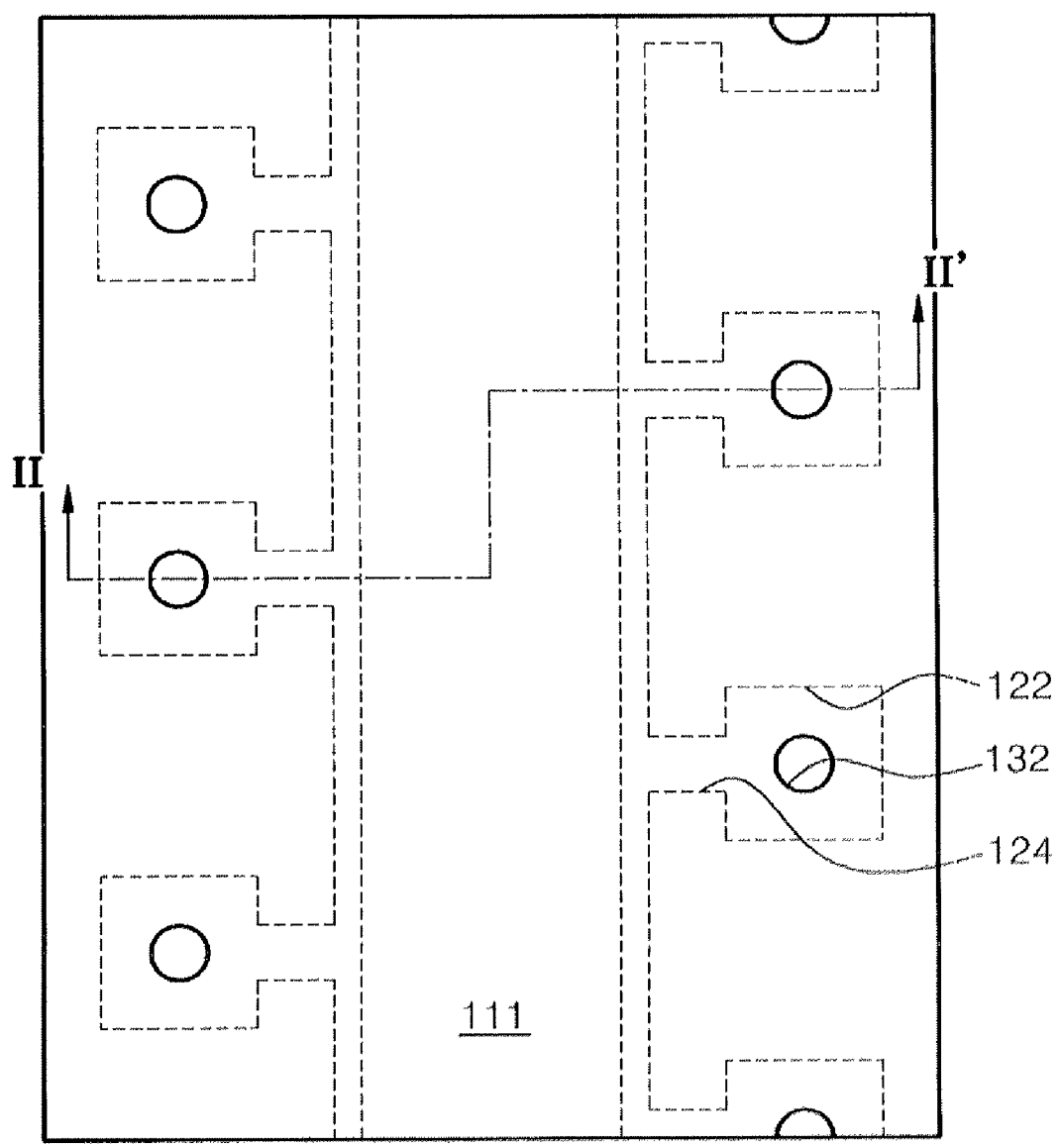
FIG. 1 is a top plan view of an inkjet printhead, to which a heater is attached, according to an exemplary embodiment of the present general inventive concept.

The present general inventive concept will now be described more fully with reference to the accompanying drawings, in which exemplary embodiments of the general inventive concept are illustrated. In the drawings, the same reference numerals denote the same elements, and the sizes or thicknesses of components may be exaggerated for clarity. Although some exemplary embodiments are described, those skilled in the art will readily appreciate that many modifications are possible in example embodiments. For example, it will also be understood that when a layer is referred to as being "on" another layer or a substrate, it can be directly on the other layer or the substrate, or intervening layers may also be present therebetween. Also, it will be understood that when a layer is referred to as being "formed on" another layer or substrate, it may be also "disposed on" the other layer or substrate. In addition, each of elements in an inkjet printhead may be formed of materials other than the material that is described herein as an example, and an order of processes in a method of manufacturing the inkjet printhead may be varied.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

A heater for an inkjet printhead according to the present general inventive concept is formed of tantalum aluminum oxynitride (Ta—Al—ON). In exemplary embodiments, the heater may be applied to a thermal inkjet printhead that ejects ink by heating ink in an ink chamber to generate bubbles therein.

Figure 2:
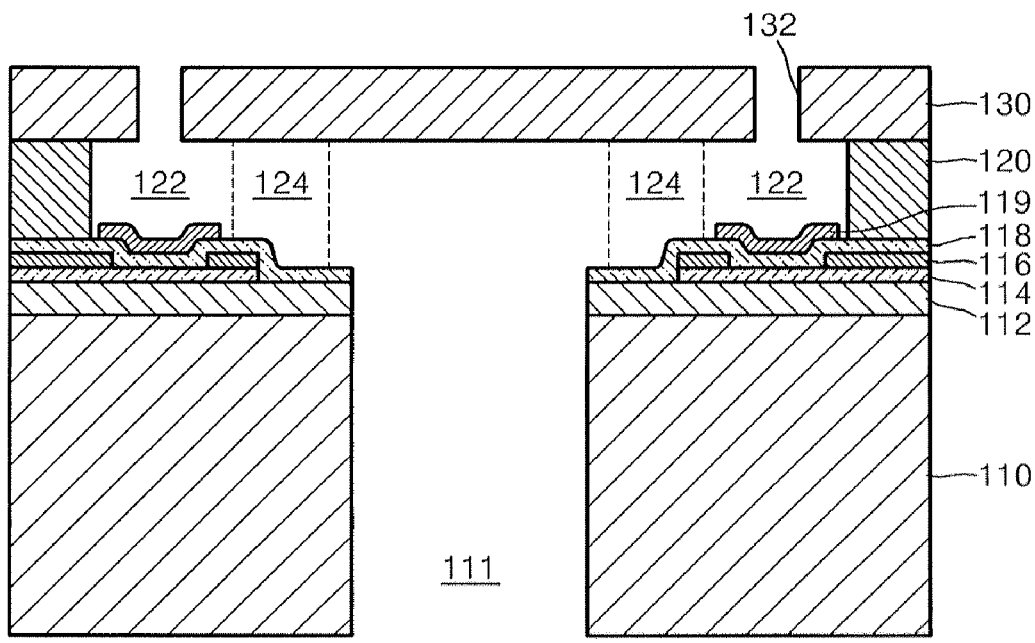
FIG. 2 is a cross-sectional view taken along line II-II' of FIG. 1.

FIG. 1 is a top plan view of a thermal inkjet printhead, to which the heater is applicable, according to an exemplary embodiment of the present general inventive concept. FIG. 2 is a cross-sectional view taken along line II-II' of FIG. 1.

Referring to FIGS. 1 and 2, a chamber layer 120 and a nozzle layer 130 can be sequentially stacked on a substrate 110 on which a plurality of material layers are formed or disposed. In exemplary embodiments, the substrate 110 may be a silicon substrate. An ink feed hole 111 through which ink is supplied is formed in the substrate 110. A plurality of ink chambers 122 in which the ink supplied through the ink feed hole 111 is filled can be formed in the chamber layer 120. A plurality of nozzles 132 through which the ink is ejected can be formed in the nozzle layer 130. An insulating layer 112 is formed on a top surface of the substrate 110 to insulate the substrate 110 from heaters 114, as will be described later. In exemplary embodiments, the insulating layer 112 may be formed of silicon oxide.

In exemplary embodiments, the heaters 114 are formed on a top surface of the insulating layer 112 to correspond to the ink chambers 122. The heaters 14 heat the ink filled in the ink chambers 122 to generate bubbles. In an exemplary embodiment, the heaters 114 are formed of tantalum aluminum oxynitride. The tantalum aluminum oxynitride may be formed of about 30 to about 60 atomic % tantalum, about 10 to about 30 atomic % aluminum, about 5 to about 30 atomic % oxygen, and about 5 to about 30 atomic % nitrogen. The heaters 114 formed of the tantalum aluminum oxynitride having the atomic concentrations may have high resistance and high reliability. In exemplary embodiments, the tantalum aluminum oxynitride of the heaters 114 may include a tantalum-aluminum (Ta—Al) alloy, tantalum nitride, tantalum oxide, and aluminum oxide. However, the present general inventive concept is not limited thereto.

In exemplary embodiments, the tantalum aluminum oxynitride may have a nano-crystalline structure or an amorphous structure. In an exemplary embodiment, the heaters 114 which are formed of the tantalum aluminum oxynitride may have a relatively high resistivity of approximately about 300 to about 1500 μΩcm. In an exemplary embodiment, the heaters 114 may be formed to a thickness of about 300 to about 3000 Å.

Electrodes 116 are formed on a top surface of the heaters 114 to supply current to the heaters 114. However, the present general inventive concept is not limited thereto. That is, the electrodes 116 may also be formed on a lateral surface of the heaters 114. In exemplary embodiments, the electrodes 116 may be formed of a material having a high electric conductivity, such as aluminum (Al), an aluminum alloy, gold (Au), or silver (Ag). However, the present general inventive concept is not limited thereto. In an exemplary embodiment, a passivation layer 118 may be formed on the insulating layer 112 to cover the heaters 114 and the electrodes 116. In further exemplary embodiments, the passivation layer 118 may be formed of silicon nitride or silicon oxide in order to prevent the heaters 114 and the electrodes 116 from being oxidized or corroded due to contact with the ink. In an exemplary embodiment, anti-cavitation layers 119 may be further formed on a top surface of the passivation layer 118 to correspond with the heaters 114 in the ink chambers 122. The anti-cavitation layers 119 may be formed of tantalum (Ta) in order to protect the heaters 114 from a cavitation force generated when the bubbles burst. The chamber layer 120 is stacked on the substrate 110 on which the plurality of material layers are formed. The plurality of ink chambers 122 in which the ink supplied through the ink feed hole 111 is filled are formed in the chamber layer 120.

In exemplary embodiments, the ink chambers 122 may be located over the heaters 114. However, the present general inventive concept is not limited thereto. Restrictors 124 which connect the ink feed hole 111 and the ink chambers 122 may be further formed in the chamber layer 120. Although not illustrated, a glue layer may be further formed between the chamber layer 120 and the substrate 110 on which the plurality of material layers are formed. The glue layer improves adhesion between the chamber layer 120 and the substrate 110. The nozzle layer 130 is stacked on the chamber layer 120. The plurality of nozzles 132 through which the ink is ejected are formed in the nozzle layer 130. In exemplary embodiments, the nozzles 132 may be arranged over the ink chambers 122. In further exemplary embodiments, each of the chamber layer 120, the glue layer, and the nozzle layer 130 may be formed of a polymer, however, the present general inventive concept is not limited thereto.

Figure 3:
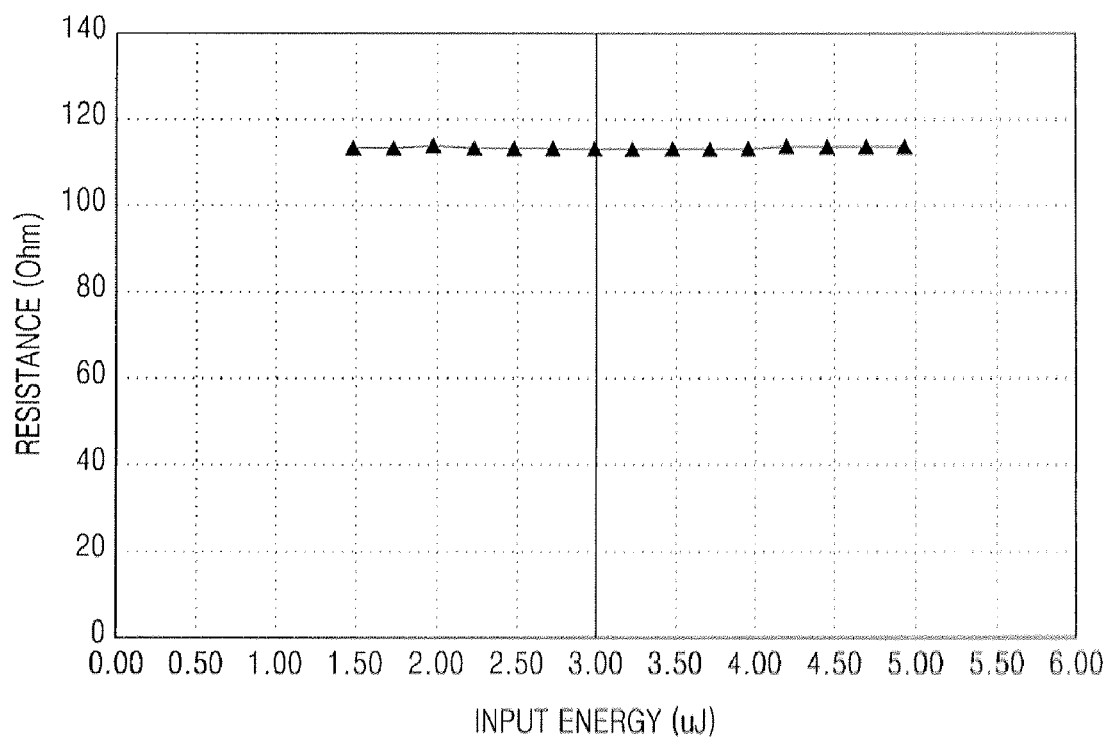
FIG. 3 is a graph illustrating a resistance of a heater according to an exemplary embodiment of the present general inventive concept with respect to an input energy which is applied to the heater in a step stress test.

FIG. 3 is a graph illustrating a resistance of a heater according to an exemplary embodiment of the present general inventive concept with respect to an input energy applied to the heater in a step stress test. In detail, FIG. 3 illustrates the resistance of a heater formed of tantalum aluminum oxynitride when an input energy which is applied to the heater is gradually increased. In this step stress test, the heater had a size of 22 μm×22 μm×900 μm. The tantalum aluminum oxynitride of the heater was formed of 45.29 atomic % tantalum, 15.24 atomic % aluminum, 14.71 atomic % oxygen, and 20.25 atomic % nitrogen. Referring now to FIG. 3, even as the input energy which was applied to the heater increased, the resistance of the heater was constantly maintained at about 110 Ohm.

A method of manufacturing the inkjet printhead including the heaters 114 of FIG. 2 will now be explained. FIGS. 4 through 7 are cross-sectional views illustrating a method of manufacturing the inkjet printhead of FIG. 2, according to an exemplary embodiment of the present general inventive concept.

Figure 4:
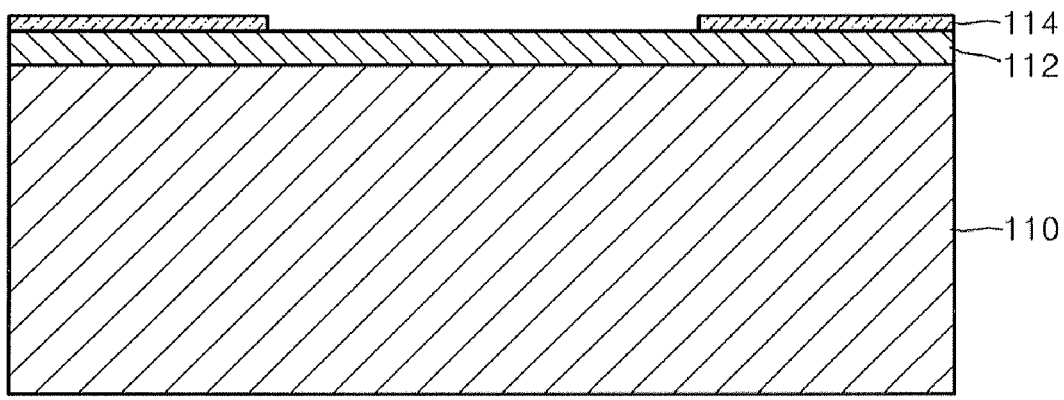
FIGS. 4 through 7 are cross-sectional views illustrating a method of manufacturing the inkjet printhead of FIG. 2, according to an exemplary embodiment of the present general inventive concept.

Referring to FIG. 4, the substrate 110 is prepared. The insulating layer 112 is formed on the substrate 110. In exemplary embodiments, the substrate 110 may be a silicon substrate, and the insulating layer 112 may be formed of silicon oxide. Next, the heaters 114 are formed on a top surface of the insulating layer 112 to heat ink and generate bubbles. In exemplary embodiments, the heaters 114 are formed of tantalum aluminum oxynitride as described above. In exemplary embodiments, the tantalum aluminum oxynitride may be formed of about 30 to about 60 atomic % tantalum, about 10 to about 30 atomic % aluminum, about 5 to about 30 atomic % oxygen, and about 5 to about 30 atomic % nitrogen. However, the present general inventive concept is not limited thereto. In exemplary embodiments, the heaters 114 may be formed by depositing the tantalum aluminum oxynitride to a thickness of approximately 300 to 3000 Å on a top surface of the insulating layer 112 through reactive sputtering. However, the present general inventive concept is not limited thereto. That is, the heaters 114 may be formed by various other methods known in the art. In the depositing of the tantalum aluminum oxynitride, the temperature of the substrate 110 may range from about 20 to about 350° C., the ratio of the sum of the flow rate of oxygen gas and the flow rate of nitrogen gas to the flow rate of argon gas may range from 0.1:1 to 0.4:1, and the ratio of the flow rate of the oxygen gas to the flow rate of the nitrogen gas may range from 0.1:1 to 10:1. In exemplary embodiments, the tantalum aluminum oxynitride deposited by the reactive sputtering may include a tantalum aluminum (Ta—Al) alloy, tantalum nitride, tantalum oxide, and aluminum oxide. The tantalum aluminum oxynitride may have a nano-crystalline structure or an amorphous structure. In an exemplary embodiment, the heaters 114 which are formed of the tantalum aluminum oxynitride may have a resistivity of about 300 to about 1500 μΩcm.

Figure 5:
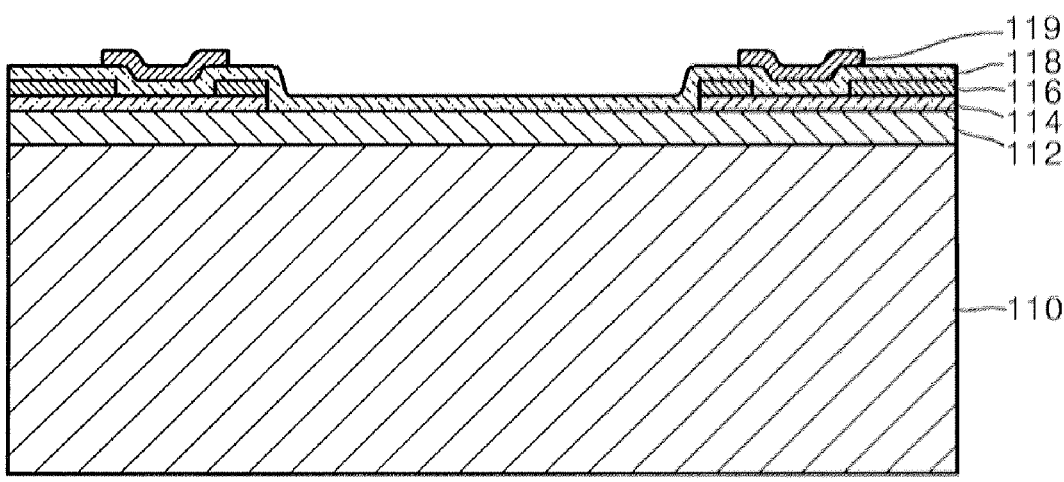

Referring to FIG. 5, the electrodes 116 are formed on a top surface of the heaters 114 to supply current to the heaters 114. However, the present general inventive concept is not limited thereto. That is, the electrodes 116 may also be formed on a lateral surface of the heaters 114. In exemplary embodiments, the electrodes 116 may be formed by depositing a metal having a high electrical conductivity, such as aluminum, an aluminum alloy, gold, or silver, on the top surface of the heaters 114 and patterning the metal. Next, the passivation layer 118 is formed on a top surface of the insulating layer 112 to cover the heaters 114 and the electrodes 116. In exemplary embodiments, the passivation layer 118 may be formed of silicon oxide or silicon nitride in order to prevent the heaters 114 and the electrodes 116 from being oxidized or corroded due to contact with the ink. In an exemplary embodiment, the anti-cavitation layers 119 may be further formed on a top surface of the passivation layer 118. In further exemplary embodiments, the anti-cavitation layers 119 may be formed of tantalum (Ta) in order to protect the heaters 114 from a cavitation force generated when the bubbles burst.

Figure 6:
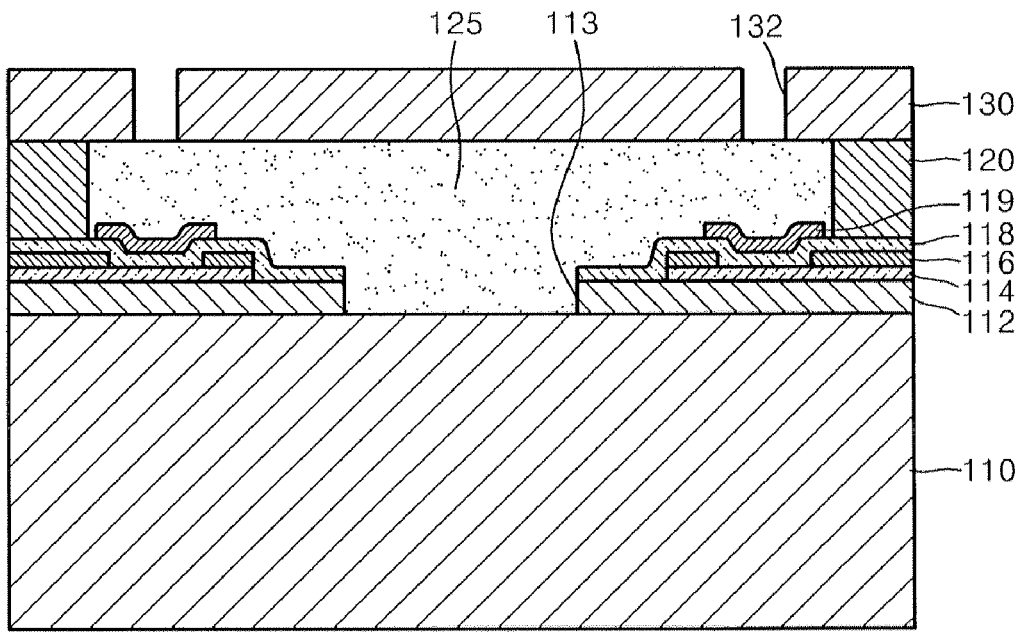

Referring to FIG. 6, the chamber layer 120 in which the plurality of ink chambers 122 (see FIG. 7) are formed is stacked on the substrate 110, on which the plurality of material layers are formed. In exemplary embodiments, the chamber layer 120 may be formed by coating a polymer on the passivation layer 118 and patterning the coated polymer to form the plurality of ink chambers 122. In this process, the restrictors 124 (see FIG. 7) which connect the ink chambers 122 and the ink feed hole 111 (see FIG. 7) may be further formed. Although not illustrated, in exemplary embodiments, a glue layer may be formed on the passivation layer 118, before the chamber layer 120 is formed. Next, the passivation layer 118 and the insulating layer 112 are sequentially etched to form a trench 113 to thereby expose a top surface of the substrate 110. In exemplary embodiments, the trench 113 may be formed over the ink feed hole 111, as will be described later.

A sacrificial layer 125 is filled in the ink chambers 122, in the restrictors 124, and in the trench 113. Next, in exemplary embodiments, top surfaces of the sacrificial layer 124 and the chamber layer 120 may be planarized by chemical mechanical polishing (CMP). The nozzle layer 130 in which the plurality of nozzles 132 are formed is stacked on top surfaces of the sacrificial layer 125 and the chamber layer 120. In exemplary embodiments, the nozzle layer 130 may be formed by coating a polymer on top surfaces of the sacrificial layer 125 and the chamber layer 120 and patterning the coated polymer to form the plurality of nozzles 132.

Figure 7:
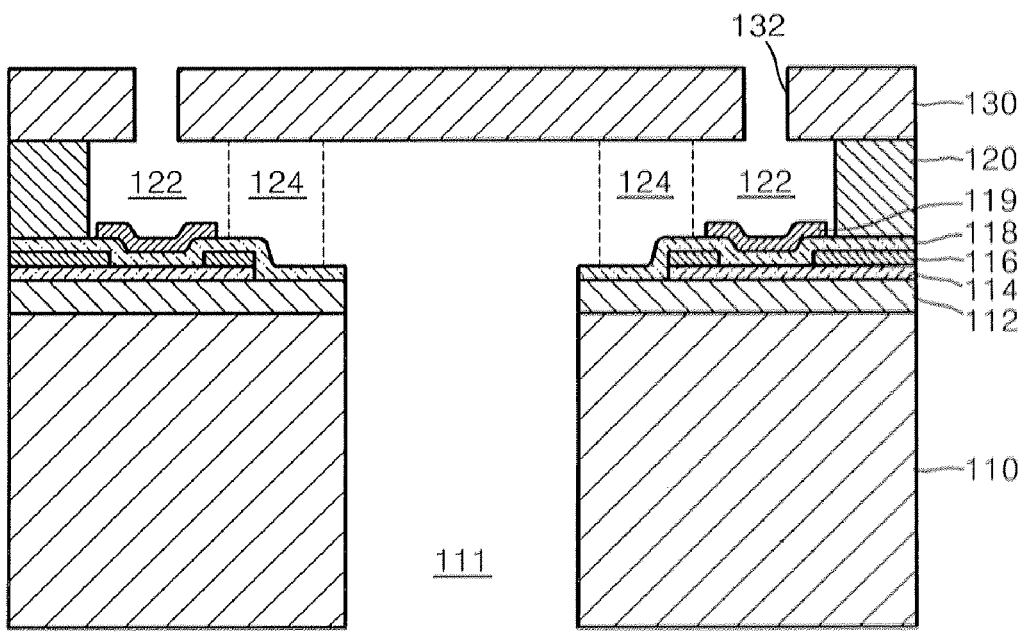

Referring to FIG. 7, the ink feed hole 111 through which the ink is supplied 110 is formed in the substrate 110. In exemplary embodiments, the ink feed hole 111 may be formed by etching a bottom surface of the substrate 110 until a bottom surface of the sacrificial layer 120 which is filled in the trench 113 is exposed. Finally, an etchant is injected through the ink feed hole 111 and into the nozzles 132 in order to etch only the sacrificial layer 125. Accordingly, the sacrificial layer 125 which is filled in the ink chambers 122, the restrictors 124, and the trench 113 is removed, thereby completing the manufacture of the inkjet printhead.

While the present general inventive concept has been particularly shown and described with reference to a few exemplary embodiments thereof, it will be understood by those of ordinary skill in the art that various changes in form and detail may be made therein without departing from the spirit and scope of the present general inventive concept as defined by the following claims. That is, although the heater formed of the tantalum aluminium oxynitride has been illustrated and described as being applied in a particular thermal inkjet printhead, in exemplary embodiments, the heater may be applied to other thermal inkjet printheads. Therefore, the scope of the present general inventive concept is defined not by the detailed description of the present general inventive concept but by the appended claims.

What is claimed is:

1. A heater of an inkjet printhead, the heater being formed of tantalum aluminum oxynitride (Ta—Al—ON), wherein the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

2. The heater of claim 1, having a resistivity of about 300 to about 1500 μΩcm.

3. The heater of claim 1, having a nano-crystalline structure or an amorphous structure.

4. The heater of claim 1, comprising a tantalum-aluminum (Ta—Al) alloy, tantalum nitride, tantalum oxide, and aluminum oxide.

5. The heater of claim 1, having a thickness of about 300 to about 3000 Å.

6. A method of manufacturing a heater of an inkjet printhead on a substrate, the method comprising depositing the heater formed of tantalum aluminum oxynitride on the substrate by reactive sputtering,
wherein the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

7. The method of claim 6, wherein the temperature of the substrate ranges from about 20 to about 350° C. during deposition of the heater, the ratio of the sum of the flow rate of oxygen gas and the flow rate of nitrogen gas to the flow rate of argon gas ranges from 0.1:1 to 0.4:1, and the ratio of the flow rate of the oxygen gas to the flow rate of the nitrogen gas ranges from 0.1:1 to 10:1.

8. The method of claim 6, wherein the heater is deposited to a thickness of about 300 to about 3000 Å.

9. An inkjet printhead comprising:
a substrate having an ink feed hole through which ink is supplied;
heaters disposed on the substrate and adapted to heat ink and generate bubbles;
electrodes disposed on the heaters to supply current to the heaters;
a chamber layer stacked on the substrate to support a plurality of ink chambers to be formed therein; and
a nozzle layer stacked on the chamber layer to allow a plurality of nozzles to be formed therein,
wherein the heaters are formed of tantalum aluminum oxynitride, and the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

10. The inkjet printhead of claim 9, wherein the heaters have a resistivity of about 300 to about 1500 μΩcm.

11. The inkjet printhead of claim 9, wherein the heaters have a thickness of about 300 to about 3000 Å.

12. The inkjet printhead of claim 9, further comprising an insulating layer disposed between the substrate and the heaters.

13. The inkjet printhead of claim 9, further comprising a passivation layer disposed on the substrate to cover the heaters and the electrode.

14. The inkjet printhead of claim 13, further comprising anti-cavitation layers disposed on the passivation layer to protect the heaters from a cavitation force generated when bubbles burst.

15. The inkjet printhead of claim 14, wherein the anti-cavitation layers include tantalum.

16. A method of manufacturing an inkjet printhead, the method comprising:
disposing heaters on a substrate;
disposing electrodes on the heaters;
stacking a chamber layer, in which a plurality of ink chambers are formed, on the substrate; and
stacking a nozzle layer, in which a plurality of nozzles are disposed, on the chamber layer,
wherein the heaters are formed of tantalum aluminum oxynitride, and the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen, and the heaters are formed by reactive sputtering.

17. The method of claim 16, wherein, in the forming of the heaters, the temperature of the substrate ranges from about 20 to about 350° C., the ratio of the sum of the flow rate of oxygen gas and the flow rate of nitrogen gas to the flow rate of argon gas ranges from 0.1:1 to 0.4:1, and the ratio of the flow rate of the oxygen gas to the flow rate of the nitrogen gas ranges from 0.1:1 to 10:1.

18. The method of claim 16, wherein the heaters are formed to a thickness of about 300 to about 3000 Å.

19. The method of claim 16, further comprising disposing a passivation layer on the substrate to cover the heaters and the electrodes, after the disposing of the electrodes.

20. The method of claim 19, further comprising anti-cavitation layers formed on the passivation layer to protect the heaters from a cavitation force generated when bubbles burst, after the disposing of the passivation layer.

21. The method of claim 20, wherein the anti-cavitation layers include tantalum.

22. The method of claim 16, further comprising forming an ink feed hole, through which ink is supplied, in the substrate, after the disposing of the nozzle layer.

23. An inkjet image forming apparatus comprising an inkjet printhead,
wherein the inkjet printhead comprises heaters formed of tantalum aluminum oxynitride, and the tantalum aluminum oxynitride is formed of about 30 to about 60 atomic % tantalum, about 10 to about 30 atomic % aluminum, about 5 to about 30 atomic % oxygen, and about 5 to about 30 atomic % nitrogen.

* * * * *